(12) United States Patent
Chepulskyy et al.

(10) Patent No.: US 12,114,578 B2
(45) Date of Patent: Oct. 8, 2024

(54) MAGNETORESISTIVE MEMORY ELEMENTS FOR SPIN-TRANSFER TORQUE (STT) AND SPIN-ORBIT TORQUE (SOT) RANDOM ACCESS MEMORIES

(71) Applicant: Samsung Electronics Co., Ltd., Suwon-si (KR)

(72) Inventors: Roman Chepulskyy, Santa Clara, CA (US); Dmytro Apalkov, San Jose, CA (US)

(73) Assignee: Samsung Electronics Co., Ltd. (KR)

( * ) Notice: Subject to any disclaimer, the term of this patent is extended or adjusted under 35 U.S.C. 154(b) by 384 days.

(21) Appl. No.: 17/675,876

(22) Filed: Feb. 18, 2022

(65) Prior Publication Data

US 2023/0180627 A1    Jun. 8, 2023

Related U.S. Application Data

(60) Provisional application No. 63/285,672, filed on Dec. 3, 2021.

(51) Int. Cl.
*H01L 51/50* (2006.01)
*H10B 61/00* (2023.01)
*H10N 50/85* (2023.01)

(52) U.S. Cl.
CPC .......... *H10N 50/85* (2023.02); *H10B 61/00* (2023.02)

(58) Field of Classification Search
CPC ........ H10N 50/85; H10N 50/10; H10B 61/00
See application file for complete search history.

(56) References Cited

U.S. PATENT DOCUMENTS

| | | |
|---|---|---|
| 7,190,557 B2 | 3/2007 | Li et al. |
| 7,770,282 B2 | 8/2010 | Zeltser et al. |
| 8,878,318 B2 | 11/2014 | Chen et al. |
| 9,276,201 B2 | 3/2016 | Pi et al. |
| 9,356,230 B2 | 5/2016 | Uchida et al. |
| 9,425,387 B1 | 8/2016 | Liu et al. |
| 11,009,570 B2 | 5/2021 | Ikhtiar et al. |
| 2013/0075839 A1 | 3/2013 | Chen et al. |
| 2014/0048893 A1 | 2/2014 | Wu et al. |
| 2015/0008547 A1 | 1/2015 | Pi et al. |
| 2019/0109277 A1 | 4/2019 | Jan et al. |
| 2020/0136018 A1 | 4/2020 | Ying et al. |
| 2020/0403143 A1 | 12/2020 | Iwata et al. |
| 2020/0403149 A1 | 12/2020 | Guisan et al. |

(Continued)

OTHER PUBLICATIONS

Extended European Search Report corresponding to European Application No. 22189928.9 (13 pages) (Feb. 13, 2023).

(Continued)

*Primary Examiner* — Anthony Ho
(74) *Attorney, Agent, or Firm* — Myers Bigel, P.A.

(57) ABSTRACT

A magnetoresistive tunnel-junction (MTJ) memory element includes a magnetic reference layer (RL), a magnetic free layer (FL), a tunneling barrier layer, which extends between the magnetic RL and the magnetic FL, and a diffusion-blocking layer (DBL), which extends on the magnetic FL. The includes at least one material selected from a group consisting of bismuth (Bi), antimony (Sb), osmium (Os), rhenium (Re), tin (Sn), rhodium (Rh), indium (In), and cadmium (Cd). An oxide capping layer is also provided on the DBL. The oxide layer may include at least one of strontium (Sr), scandium (Sc), beryllium (Be), calcium (Ca), yttrium (Y), zirconium (Zr), and hafnium (Hf).

16 Claims, 4 Drawing Sheets

(56) References Cited

U.S. PATENT DOCUMENTS

2021/0159393 A1  5/2021  Law et al.
2021/0257541 A1  8/2021  Kariyada et al.

OTHER PUBLICATIONS

Apalkov et al. "Magnetoresistive Random Access Memory" Proceedings of the IEEE 104(10):1796-1830 (Oct. 2016).
European Office Action corresponding to European Application No. 22189928.9 (10 pages) (Jul. 5, 2023).
European Office Action corresponding to European Application No. 22189928.9 (6 pages) (Dec. 19, 2023).

MAGNETORESISTIVE MEMORY ELEMENTS FOR SPIN-TRANSFER TORQUE (STT) AND SPIN-ORBIT TORQUE (SOT) RANDOM ACCESS MEMORIES

REFERENCE TO PRIORITY APPLICATION

This application claims priority to U.S. Provisional Application No. 63/285,672, filed Dec. 3, 2021, entitled "Magnetoresistive Random-Access Memory (MRAM) Including a Diffusion-Blocking Layer and Methods of Forming the Same," the disclosure of which is hereby incorporated herein by reference.

FIELD

The present invention relates to integrated circuit memory devices and, more particularly, to nonvolatile integrated circuit memory devices and methods of fabricating same.

BACKGROUND

Conventional magnetoresistive random access memory (MRAM) devices typically utilize a magnetoresistive (a/k/a magnetic) tunnel-junction (MTJ) as a nonvolatile memory element, which may be defined, in simplified form, as a vertical stack of three layers. These three layers include: (i) a magnetic reference layer, which is often referred to as a "pinned" or "fixed" magnetic layer, (ii) a tunneling barrier layer, which is often referred to as a tunneling dielectric layer, and (iii) a magnetic free layer. As will be understood by those skilled in the art, an MTJ may be programmed to define a "0" or "1" logic state by setting the "field" of the magnetic free layer to be parallel to, or anti-parallel to, the field of the magnetic reference layer during a memory write operation. Thus, as shown by FIG. 1A, an MTJ 10 can be set to have a "first" logic state by setting the magnetization of the magnetic free layer 12 to be parallel to the magnetization of the magnetic reference layer 16, so that a relatively low resistance state is present when a read current is established across the layers of the MTJ 10, including a tunneling barrier layer 14, which separates the magnetic free layer 12 from the magnetic reference layer 16. Alternatively, the MTJ 10 can be set to have a "second" logic state by setting the magnetization of the magnetic free layer 12 to be anti-parallel to the magnetization of the magnetic reference layer 16, so that a relatively high resistance state is present when a read current is established across the layers of the MTJ 10. Although not shown, a conventional MTJ may also be configured to support "vertical" or "perpendicular" spin directions rather than the "horizontal" ones illustrated by FIG. 1A.

In addition, as shown on the left side of FIG. 1B, a spin-transfer torque (STT) MRAM 20a (having a single "read/write" select transistor T1) may be programmed during a write operation by passing a "write" current in a first direction through the layers of the MTJ 10 in order to program a logic "0", and in a second direction, opposite the first direction, in order to program a logic "1". Moreover, shorter access times resulting from faster programming can be achieved by using higher write currents, but such higher currents can cause incremental damage to the layers of the MTJ 10 in response to repeated programming, and thereby lower the long term endurance and reliability of the STT-M RAM 20a.

Fortunately, as shown on the right side of FIG. 1B, a spin-orbit torque (SOT) MRAM 20b (having separate read and write select transistors T1, T2) may be programmed by passing a "write" current across a separate "strap" layer 18, which shares an interface with the magnetic free layer 12. As shown by the separate read current and write current paths, the use of the strap layer 18 to support the write current operates to decouple the write current path from the read current path, and thereby avoids the potential endurance and reliability limitations associated with the STT-M RAM 20a, but at the expense of a somewhat larger per-bit layout footprint caused by the additional write select transistor T2 within each memory cell.

Referring now to FIG. 2, a more representative MTJ 10' according to the prior art is shown as including a seed layer 22, upon which a stack of a bottom magnetic reference layer 24a, a Ruderman-Kittel-Kasuya-Yosida (RKKY) spacer/coupling layer 24b, and a top magnetic reference layer 24c may be sequentially formed as a composite magnetic reference layer 24. Conventional devices related to the MTJ 10' are disclosed in an article by D. Apalkov, B. Dieny and J. M. Slaughter, entitled "*Magnetoresistive Random Access Memory*," Proceedings of the IEEE, vol. 104, no. 10, pp. 1796-1830, October 2016.

The MTJ 10' also includes a tunneling barrier layer 26, which may be configured as a magnesium oxide (Mg—O) layer, and a magnetic free layer 28 directly on the tunneling barrier layer 26. An oxide cap 30, which may be configured as a magnesium oxide (Mg—O) layer, is also provided on the magnetic free layer 28, as shown. Although not wishing to be bound by any theory, an oxide cap for high efficiency and/or optimum tunnel magnetoresistance (TMR) may have inadequate post-annealing stability when compared to other lower performance oxide caps. Thus, there exists a need to develop MTJ-based nonvolatile memory elements having high performance oxide caps and superior post-anneal stability.

SUMMARY

Nonvolatile memories according to embodiments of the invention may utilize magnetoresistive tunnel-junction (MTJ) memory elements with improved thermal stability during fabrication, and improved post-fabrication yield and endurance. According to some of these embodiments, an MTJ memory element is provided, which includes a magnetic reference layer (RL), a magnetic free layer (FL), and a tunneling barrier layer, which extends between the magnetic RL and the magnetic FL. In addition, to enhance thermal stability, a diffusion-blocking layer (DBL) is provided on the magnetic FL, which extends between the DBL and the tunneling barrier layer. This DBL is configured to have: (i) relatively high thermal stability (e.g., annealing stability), (ii) relatively high diffusion barrier energy (Eb) or relatively high segregation tendencies towards its layer interface(s), and (iii) reduced lattice mismatch vis-à-vis adjacent layers, may include at least one material selected from a group consisting of bismuth (Bi), antimony (Sb), osmium (Os), rhenium (Re), tin (Sn), rhodium (Rh), indium (In), and cadmium (Cd). In some embodiments, an oxide layer, such as an oxide capping layer is provided on the DBL. The DBL may also have a thickness in a range from 1 Å to 10 Å, whereas the oxide layer may have a thickness in a range from 2 Å to 20 Å. In some embodiments of the invention, the oxide layer may include magnesium oxide (Mg—O); however, in other embodiments, the oxide layer may include at least one of strontium oxide (Sr—O), tantalum oxide (Ta—O), scandium oxide (Sc—O), beryllium oxide (Be—O), calcium oxide (Ca—O), yttrium oxide (Y—O), zirconium oxide (Zr—O), and hafnium oxide (Hf—O).

According to further embodiments of the invention, the DBL includes a stacked composite of a first DBL of a first material, and a second DBL of a second material, which extends between the first DBL and the oxide layer. This first material may be a material selected from a group consisting of magnesium (Mg), aluminum (Al), scandium (Sc), titanium (Ti), vanadium (V) and chromium (Cr). The oxide layer may also be configured as a composite of: (i) a first oxide layer, which includes at least one oxide selected from a group consisting of scandium oxide (Sc—O), strontium oxide (Sr—O) and calcium oxide (Ca—O), and (ii) a second oxide layer, which includes at least one oxide selected from a group consisting of tantalum oxide (Ta—O) and hafnium oxide (Hf—O). This first oxide layer extends between the DBL and the second oxide layer, which may be thicker than the first oxide layer.

According to additional embodiments of the invention, a spin-transfer torque magnetoresistive random access memory (STT-MRAM) element is provided, which includes a magnetic reference layer (RL), a magnetic free layer (FL), a tunneling barrier layer extending between the magnetic RL and the magnetic FL, and a seed layer under the magnetic RL. In some of these embodiments, the magnetic RL may include a stacked composite of first and second magnetic reference layers having a Ruderman-Kittel-Kasuya-Yosida (RKKY) coupling layer extending therebetween, which is designed to facilitate antiferromagnetic coupling between the bottom RL and the top RL.

In addition, a diffusion-blocking layer (DBL) is provided on the magnetic FL, and an oxide "capping" layer is provided on the DBL. Advantageously, the DBL operates to improve, among other things, the annealing stability of the memory element during fabrication, by suppressing out-diffusion from the magnetic FL (i.e., interdiffusion between the FL and oxide capping layer), and suppressing out-diffusion from the capping layer. In some of these embodiments, the DBL may have a thickness in a range from 1 Å to 10 Å, and may include at least one material selected from a group consisting of bismuth (Bi), antimony (Sb), osmium (Os), rhenium (Re), tin (Sn), rhodium (Rh), indium (In), and cadmium (Cd). The DBL may even be configured as a stacked composite of a first DBL, and a second DBL (of a different material) extending between the first DBL and the oxide capping layer. This first DBL may include a first material selected from a group consisting of magnesium (Mg), aluminum (Al), scandium (Sc), titanium (Ti), vanadium (V) and chromium (Cr), which contacts the magnetic FL. In still further embodiments of the invention, the oxide capping layer may include a stacked composite of: (i) a scandium oxide (Sc—O) layer, a strontium oxide (Sr—O) layer and/or a calcium oxide (Ca—O) layer, which contacts the DBL, and (ii) a tantalum oxide (Ta—O) layer and/or a hafnium oxide (Hf—O) layer thereon.

According to further embodiments of the invention, a spin-orbit torque magnetoresistive random access memory (SOT-MRAM) element is provided, which includes a magnetic reference layer (RL), a magnetic free layer (FL), and a tunneling barrier layer, which extends between the magnetic RL and the magnetic FL. In addition, to enhance thermal stability during fabrication, a diffusion-blocking layer (DBL) is provided on the magnetic FL. This DBL includes at least one material selected from a group consisting of bismuth (Bi), antimony (Sb), osmium (Os), rhenium (Re), tin (Sn), rhodium (Rh), indium (In), and cadmium (Cd). A shunt-current reducing oxide (SRO) layer is also provided on the DBL, and a spin-orbit torque write line is provided on the SRO layer. This SRO layer may include at least one material selected from a group consisting of magnesium oxide (Mg—O), calcium oxide (Ca—O), scandium oxide (Sc—O), titanium oxide (Ti—O), vanadium oxide (V-O), iron oxide (Fe—O), nickel oxide (Ni—O), cobalt oxide (Co—O), zirconium oxide (Zr—O), niobium oxide (Nb—O), tantalum oxide (Ta—O), tungsten oxide (MO), and osmium oxide (Os—O). The DBL may also have a thickness in a range from 1 Å to 10 Å, and extend between the SRO layer and the magnetic FL.

DETAILED DESCRIPTION

Figure 1:
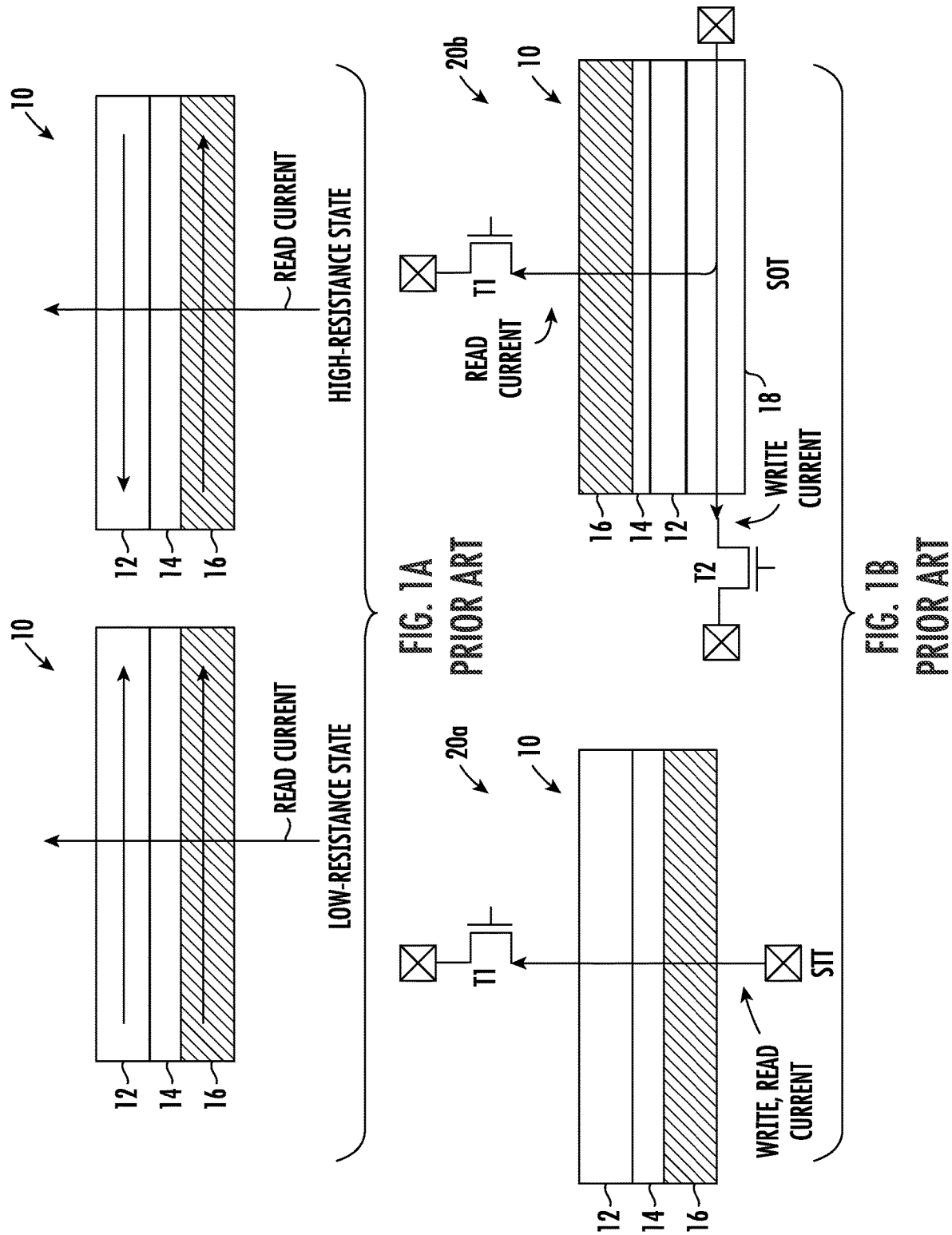
FIG. 1A is a cross-sectional diagram of a conventional magnetoresistive tunnel-junction (MTJ), which operates as a nonvolatile memory element, when programmed into a low-resistance program state and a high-resistance program state.
FIG. 1B is a simplified schematic of a spin-transfer torque (STT) MRAM unit cell and a spin-orbit torque (SOT) MRAM unit cell, according to the prior art.
Figure 2:
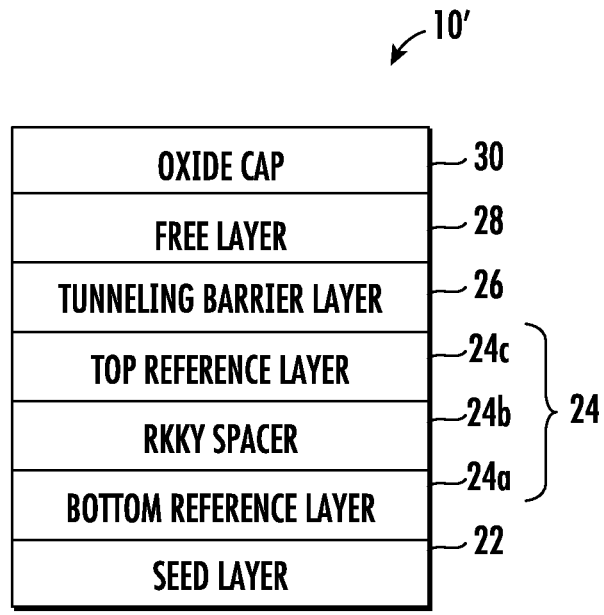
FIG. 2 is a cross-sectional diagram of a conventional magnetoresistive tunnel-junction (MTJ), which can operate as a nonvolatile memory element.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art.

In the drawing, the thickness of layers and regions are exaggerated for clarity. It will also be understood that when a layer is referred to as being "on" another layer or substrate, it can be directly on the other layer or substrate, or an intervening layer(s) may also be present. Like reference numerals refer to like elements throughout. In addition, each reference to a metal (M) oxide (O) herein, which is identified as M—O, represents a metal oxide compound $M_xO_y$, where M designates a metal, O designates oxygen, with varying stoichiometric subscripts: $x \geq 1$, $y \geq 1$.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
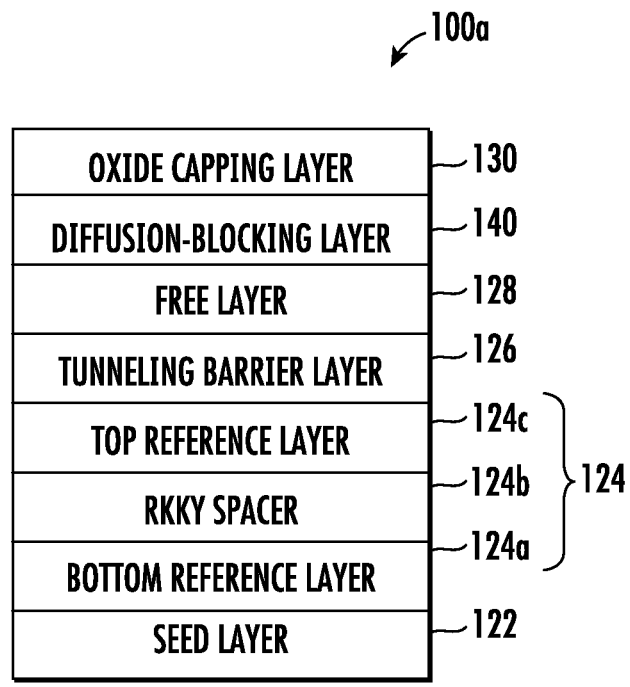
FIG. 3 is a cross-sectional diagram of a nonvolatile magnetoresistive tunnel-junction (MTJ) memory element, according to an embodiment of the invention.

Referring now to FIG. 3, a nonvolatile magnetoresistive tunnel-junction (MTJ) memory element 100a according to an embodiment of the invention is illustrated as including a vertical stack of: (i) a seed layer 122, (ii) a magnetic reference layer (RL) 124 on the seed layer 122, (iii) a tunneling barrier layer 126 on the magnetic RL 124, and (iv) a magnetic free layer (FL) 128 on the tunneling barrier layer 126. As shown, the magnetic RL 124 is configured as a stacked composite of a bottom magnetic RL 124a, a Ruderman-Kittel-Kasuya-Yosida (RKKY) coupling/spacer layer 124b, and a top magnetic RL 124c on the spacer layer 124b.

According to some of these embodiments, the seed layer 122 may include a material selected from a group consisting of Ir, Ru, Ta, for example, and may have a thickness in a range from about 10 Å to about 2000 Å. In addition, the bottom magnetic RL 124a may include a material selected from a group consisting of Co/Pt multilayers or Co—Pt alloys or another material including multilayers of magnetic materials such as Co or Fe with non-magnetic materials such as Pt or Pd, and may have a thickness in a range from about 10 Å to about 500 Å; the Ruderman-Kittel-Kasuya-Yosida (RKKY) coupling layer 124b may include a material selected from a group consisting of Ru, Rh, Ir and alloys thereof, and may have a thickness in a range from about 3 Å to about 18 Å; and the top magnetic RL 124c may include a material selected from a group consisting of Co/Pt multilayers or alloys with an optional non-magnetic or weakly-magnetic insertion layer and CoFeB next to the tunneling barrier layer 126, and may have a thickness in a range from about 5 Å to about 200 Å. The tunneling barrier layer 126 may be configured as a magnesium oxide (Mg—O) layer and/or a Mg—Al—O layer, for example, and have a thickness in a range from about 4 Å to about 20 Å. The magnetic FL 128 may include a material selected from a group consisting of Co, Fe, B, Nb, Ta, Mo, Si, Zr, Ge, W, and may have a thickness in a range from about 4 Å to about 50 Å.

Advantageously, to enhance thermal stability, a diffusion-blocking layer (DBL) 140 is provided, which extends between (and forms interfaces with) the magnetic FL 128 and an oxide capping layer 130, as shown. In particular, to suppress interdiffusion between the FL 128 and the oxide capping layer 130, the DBL 140 preferably has: (i) relatively high thermal stability (e.g., annealing stability), (ii) relatively high diffusion barrier energy (Eb) or relatively high segregation tendencies towards its layer interface(s), and (iii) reduced lattice mismatch vis-à-vis the adjacent magnetic FL 128 and the oxide capping layer 130. In particular, as described in the aforementioned U.S. Provisional Application No. 63/285,672, filed Dec. 3, 2021, which is hereby incorporated herein by reference, the annealing stability of the oxide capping layer 130 can be improved by configuring the DBL 140 such that, among other things, an increase in diffusion barrier energy (Eb) or relatively high segregation tendency, and a reduced lattice mismatch is achieved relative to a conventional interface between a magnetic FL and an oxide (e.g., Mg—O) capping layer (while maintaining sufficient perpendicular magnetic anisotropy (PMA) relative to the conventional interface).

Moreover, according to some embodiments of the invention, the DBL 140 may have a thickness in a range from 1 Å to 10 Å, and may include at least one material selected from a group consisting of bismuth (Bi), antimony (Sb), osmium (Os), rhenium (Re), tin (Sn), rhodium (Rh), indium (In), and cadmium (Cd). Although not wishing to be bound by any theory, osmium (Os), rhenium (Re) and rhodium (Rh) are believed to have a lower segregation tendency towards the free layer and oxide layer interfaces, but a relatively high diffusion barrier, which suggests that these elements may remain as deposited during post-annealing. Alternatively, bismuth (Bi), indium (In) and cadmium (Cd) are believed to have a lower diffusion barrier, but a higher segregation tendency towards the interfaces so diffusion during post-annealing is not likely to move these elements out of the interfaces. Moreover, within the group of eight elements, a first sub-group of bismuth (Bi), antimony (Sb), osmium (Os), rhenium (Re), and tin (Sn) may be chosen relative to a second sub-group of rhodium (Rh), indium (In), and cadmium (Cd), in some embodiments, based on a likelihood of stability (and other properties) of a subsequently formed oxide cap, which is described hereinbelow. A uniformity in the thickness of the DBL 140 may also be enhanced by cooling an intermediate-stage substrate containing the magnetic FL 128 to a temperature of about −250° C. to about −100° C. prior to deposition of the DBL 140.

The oxide capping layer 130 of FIG. 3, which is provided on the DBL 140, may have a thickness in a range from 2 Å to 20 Å, and may be formed of magnesium oxide (Mg—O) or another oxide. However, as shown by the magnetoresistive tunnel-junction (MTJ) memory element 100b of FIG. 4, an alternative oxide capping layer 130' may include at least one of strontium oxide (Sr—O), scandium oxide (Sc—O), beryllium oxide (Be—O), calcium oxide (Ca—O), tantalum oxide (Ta—O), yttrium oxide (Y—O), zirconium oxide (Zr—O), and hafnium oxide (Hf—O), which may provide lower formation energies and a high oxygen diffusion barrier.

Figure 4:
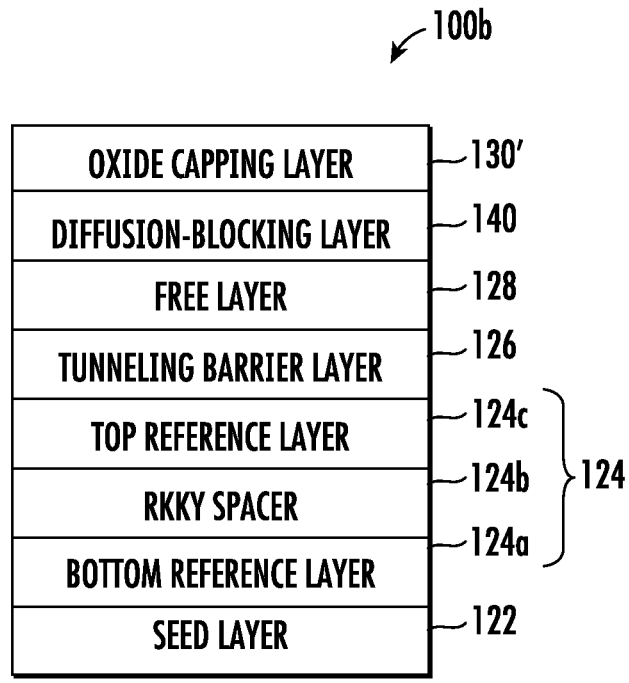
FIG. 4 is a cross-sectional diagram of a nonvolatile magnetoresistive tunnel-junction (MTJ) memory element, according to an embodiment of the invention.
Figure 5:
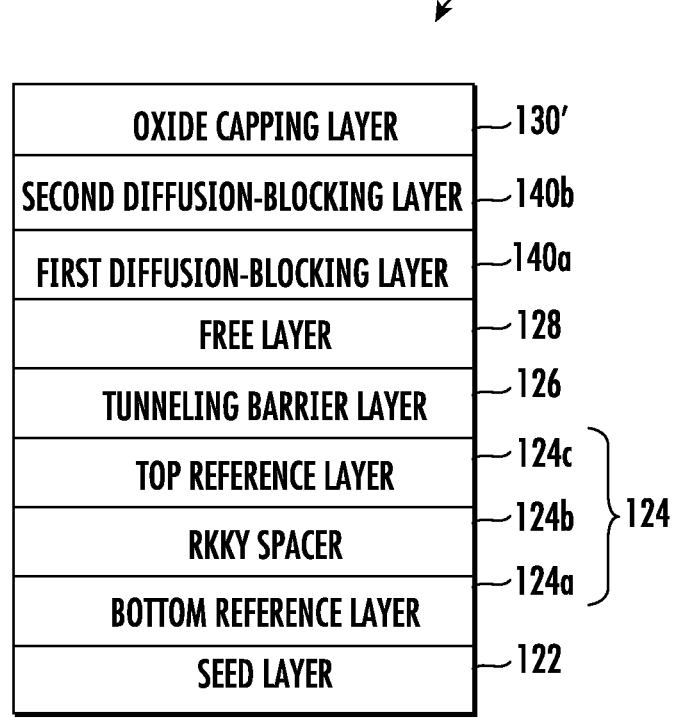
FIG. 5 is a cross-sectional diagram of a nonvolatile magnetoresistive tunnel-junction (MTJ) memory element, according to an embodiment of the invention.

In addition, as shown by the magnetoresistive tunnel-junction (MTJ) memory element 100c of FIG. 5, the DBL 140 of FIGS. 3-4 may be modified to include a stacked composite of a first DBL 140a of a first material, and a second DBL 140b of a second material, which extends between the first DBL 140a and the oxide capping layer 130'. This first material may be a material selected from a group consisting of magnesium (Mg), aluminum (Al), scandium (Sc), titanium (Ti), vanadium (V) and chromium (Cr), whereas the second material may include at least one of bismuth (Bi), antimony (Sb), osmium (Os), rhenium (Re), tin (Sn), rhodium (Rh), indium (In), and cadmium (Cd). Although not wishing to be bound by any theory, the first DBL 140a may operate to suppress out-diffusion of atoms from the second DBL 140b into the magnetic FL 128 (e.g., during deposition and post-annealing of the second DBL 140b).

Figure 6:
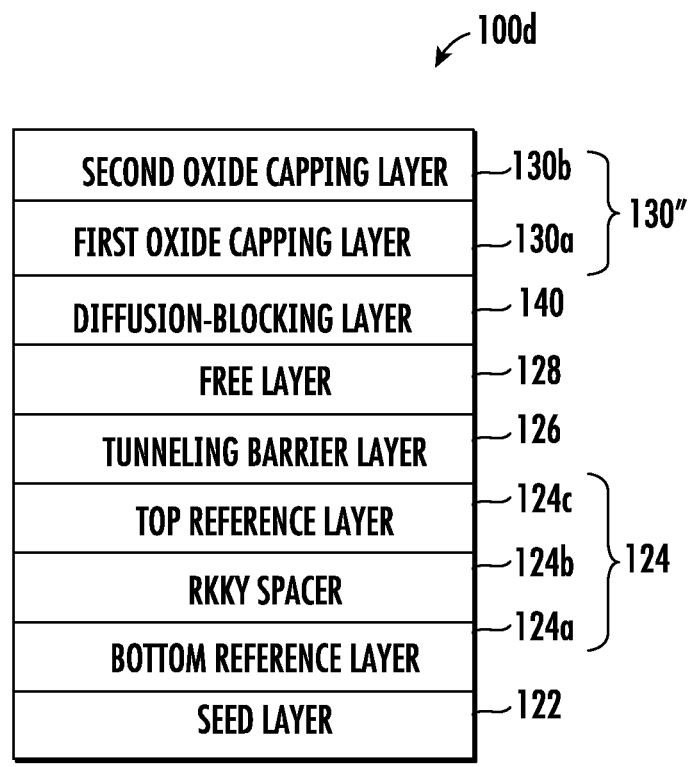
FIG. 6 is a cross-sectional diagram of a nonvolatile magnetoresistive tunnel-junction (MTJ) memory element, according to an embodiment of the invention.

Referring now to the magnetoresistive tunnel-junction (MTJ) memory element 100d of FIG. 6, the oxide capping layers 130, 130' of FIGS. 3-5 may be modified to include a stacked composite of: (i) a first oxide layer 130a for superior annealing stability, which includes at least one oxide selected from a group consisting of scandium oxide (Sc—O), strontium oxide (Sr—O) and calcium oxide (Ca—O), and (ii) a second oxide layer 130b for good figure-of-merit (FOM), which includes at least one oxide selected from a group consisting of magnesium oxide (Mg—O), tantalum oxide (Ta—O) and hafnium oxide (Hf—O), and may be thicker than the first oxide layer 130a.

Figure 7:
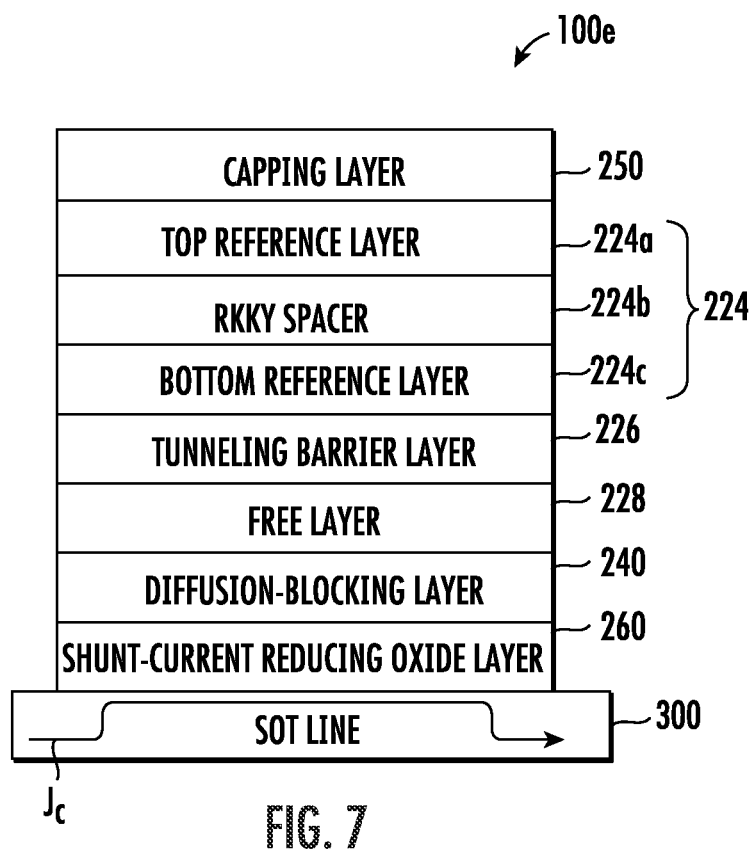
FIG. 7 is a cross-sectional diagram of a nonvolatile magnetoresistive tunnel-junction (MTJ) memory element of a spin-orbit torque (SOT) MRAM device, according to an embodiment of the invention.

Finally, as shown by FIG. 7, a spin-orbit torque magnetoresistive random access memory (SOT-MRAM) element 100e according to another embodiment of the invention includes: (i) a magnetic reference layer 224 having a capping layer 250 thereon (e.g., nitride, such as Ta—N, Ti—N), (ii) a magnetic free layer 228, (iii) a tunneling barrier layer 226 extending between the magnetic reference layer 224 and the magnetic free layer 228, and (iv) a diffusion-blocking layer 240 on the magnetic free layer 228. The magnetic reference layer 224 is shown as including a stacked composite of a top reference layer 224a, a Ruderman-Kittel-Kasuya-Yosida (RKKY) coupling/spacer layer 224b, and a bottom reference layer 224c. In some embodiments of the memory element 100e, the layers (i) through (iv) may be configured as described hereinabove with respect to memory elements 100a-100d of FIGS. 3-6.

The SOT-MRAM element 100e of FIG. 7 further includes a thin shunt-current reducing oxide (SRO) layer 260, which extends between the diffusion-blocking layer 240 and a SOT write/read line 300, which may have a relatively high resistance and perform the same function as the strap layer 18 of the SOT-MRAM 20b of FIG. 1B during write and read operations. Advantageously, the SRO layer 260 is thin (to improve interfacial transparency) and provides a relatively high parallel resistance relative to the SOT write/read line 300, so that a lateral shunt current $J_c$ is blocked from passing laterally through the relatively low resistance free layer 228 during a write operation. The diffusion-blocking layer 240 also enhances the annealing stability of the thin SRO layer 260.

According to some of these embodiments, the SRO layer includes at least one material selected from a group consisting of magnesium oxide (Mg—O), calcium oxide (Ca—O), scandium oxide (Sc—O), titanium oxide (Ti—O), vanadium oxide (V-O), iron oxide (Fe—O), nickel oxide (Ni—O), cobalt oxide (Co—O), zirconium oxide (Zr—O), niobium oxide (Nb—O), tantalum oxide (Ta—O), tungsten oxide (W—O), and osmium oxide (Os—O), and has a thickness in a range from about 2 Å to about 10 Å.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A magnetoresistive tunnel-junction (MTJ) memory element, comprising:
   a magnetic reference layer (RL);
   a magnetic free layer (FL);
   a tunneling barrier layer extending between the magnetic RL and the magnetic FL;
   a diffusion-blocking layer (DBL) on the magnetic FL, said DBL comprising at least one material selected from a group consisting of bismuth (Bi), antimony (Sb), osmium (Os), rhenium (Re), tin (Sn), rhodium (Rh), indium (In), and cadmium (Cd); and
   an oxide layer having a thickness in a range from 2 Å to 20 Å, on the DBL, which extends between the oxide layer and the magnetic FL; and
   wherein the magnetic FL extends between the tunneling barrier layer and the DBL, which defines an interface with the magnetic FL.

2. The memory element of claim 1, wherein the DBL has a thickness in a range from 1 Å to 10 Å.

3. The memory element of claim 1, wherein the oxide layer comprises at least one of scandium oxide (Sc—O) and magnesium oxide (Mg—O).

4. The memory element of claim 1, wherein the oxide layer comprises at least one of strontium oxide (Sr—O), tantalum oxide (Ta—O), beryllium oxide (Be—O), calcium oxide (Ca—O), yttrium oxide (Y—O), zirconium oxide (Zr—O), titanium oxide (Ti—O), and hafnium oxide (Hf—O).

5. The memory element of claim 1, wherein the DBL comprises a stacked composite of:
   a first DBL comprising a first material; and
   a second DBL comprising a second material different from the first material, extending between the first DBL and the oxide layer.

6. The memory element of claim 5, wherein the first DBL comprises at least one material selected from a group consisting of magnesium (Mg), aluminum (Al), scandium (Sc), titanium (Ti), vanadium (V) and chromium (Cr).

7. A magnetoresistive tunnel-junction (MTJ) memory element, comprising:
   a magnetic reference layer (RL);
   a magnetic free layer (FL);
   a tunneling barrier layer extending between the magnetic RL and the magnetic FL;
   a diffusion-blocking layer (DBL) on the magnetic FL, said DBL comprising at least one material selected from a group consisting of bismuth (Bi), antimony (Sb), osmium (Os), rhenium (Re), tin (Sn), rhodium (Rh), indium (In), and cadmium (Cd); and
   an oxide layer on the DBL, which extends between the oxide layer and the magnetic FL;
   wherein the magnetic FL extends between the tunneling barrier layer and the DBL, which defines an interface with the magnetic FL; and
   wherein the oxide layer comprises a composite of:
      a first oxide layer comprising at least one oxide selected from a group consisting of scandium oxide (Sc—O), strontium oxide (Sr—O) and calcium oxide (Ca—O); and
      a second oxide layer comprising at least one oxide selected from a group consisting of tantalum oxide (Ta—O) and hafnium oxide (Hf—O).

8. The memory element of claim 7, wherein the first oxide layer extends between the second oxide layer and the DBL.

9. The memory element of claim 8, wherein the second oxide layer is thicker than the first oxide layer.

10. The memory element of claim 1, wherein the oxide layer is a shunt-current reducing oxide (SRO) layer comprising at least one material selected from a group consisting of magnesium oxide (Mg—O), calcium oxide (Ca—O), scandium oxide (Sc—O), titanium oxide (Ti—O), vanadium oxide (V—O), iron oxide (Fe—O), nickel oxide (Ni—O), cobalt oxide (Co—O), zirconium oxide (Zr—O), niobium oxide (Nb—O), tantalum oxide (Ta—O), tungsten oxide (W—O), and osmium oxide (Os—O.

11. A spin-transfer torque magnetoresistive random access memory (STT-MRAM) element, comprising:
 a magnetic reference layer (RL);
 a magnetic free layer (FL);
 a tunneling barrier layer extending between the magnetic RL and the magnetic FL;
 a diffusion-blocking layer (DBL) on the magnetic FL, said DBL having a thickness in a range from 1 Å to 10 Å, and comprising at least one material selected from a group consisting of bismuth (Bi), antimony (Sb), osmium (Os), rhenium (Re), tin (Sn), rhodium (Rh), indium (In), and cadmium (Cd);
 an oxide layer on the DBL; and
 a seed layer on the magnetic RL.

12. The memory element of claim 11, wherein the magnetic RL comprises a stacked composite of first and second magnetic reference layers having a Ruderman-Kittel-Kasuya-Yosida (RKKY) coupling layer extending therebetween.

13. The memory element of claim 11, wherein the DBL comprises a stacked composite of:
 a first DBL comprising a first material selected from a group consisting of magnesium (Mg), aluminum (Al), scandium (Sc), titanium (Ti), vanadium (V) and chromium (Cr), which contacts the magnetic FL; and
 a second DBL comprising a second material different from the first material, extending between the first DBL and the oxide layer.

14. The memory element of claim 11, wherein the oxide layer comprises a stacked composite of:
 a scandium oxide (Sc—O) layer, a strontium oxide (Sr—O) layer and/or a calcium oxide (Ca—O) layer, which contacts the DBL; and
 a tantalum oxide (Ta—O) layer and/or a hafnium oxide (Hf—O) layer thereon.

15. A spin-orbit torque magnetoresistive random access memory (SOT-MRAM) element, comprising:
 a magnetic reference layer (RL);
 a magnetic free layer (FL);
 a tunneling barrier layer extending between the magnetic RL and the magnetic FL;
 a diffusion-blocking layer (DBL) on the magnetic FL, said DBL comprising at least one material selected from a group consisting of bismuth (Bi), antimony (Sb), osmium (Os), rhenium (Re), tin (Sn), rhodium (Rh), indium (In), and cadmium (Cd);
 a shunt-current reducing oxide (SRO) layer on the DBL; and
 a spin-orbit torque write line on the SRO layer, said SRO layer comprising at least one material selected from a group consisting of magnesium oxide (Mg—O), calcium oxide (Ca—O), scandium oxide (Sc—O), titanium oxide (Ti—O), vanadium oxide (V—O), iron oxide (Fe—O), nickel oxide (Ni—O), cobalt oxide (Co—O), zirconium oxide (Zr—O), niobium oxide (Nb—O), tantalum oxide (Ta—O), tungsten oxide (W—O), and osmium oxide (Os—O).

16. The memory element of claim 15, wherein the DBL has a thickness in a range from 1 Å to 10 Å, and extends between and contacts the SRO layer and the magnetic FL.

* * * * *